(12) United States Patent
Murata et al.

(10) Patent No.: US 12,402,533 B2
(45) Date of Patent: Aug. 26, 2025

(54) RESIDUAL CHARGE REMOVAL DEVICE

(71) Applicant: KELK Ltd., Kanagawa (JP)

(72) Inventors: Tomonori Murata, Kanagawa (JP); Isao Shibata, Kanagawa (JP)

(73) Assignee: KELK Ltd., Kanagawa (JP)

( * ) Notice: Subject to any disclaimer, the term of this patent is extended or adjusted under 35 U.S.C. 154(b) by 602 days.

(21) Appl. No.: 17/795,996

(22) PCT Filed: Jan. 26, 2021

(86) PCT No.: PCT/JP2021/002610
§ 371 (c)(1),
(2) Date: Jul. 28, 2022

(87) PCT Pub. No.: WO2021/157427
PCT Pub. Date: Aug. 12, 2021

(65) Prior Publication Data
US 2023/0073032 A1    Mar. 9, 2023

(30) Foreign Application Priority Data
Feb. 5, 2020   (JP) .................................. 2020-017945

(51) Int. Cl.
H10N 10/17         (2023.01)
H01M 10/613        (2014.01)
H10N 10/01         (2023.01)

(52) U.S. Cl.
CPC ............. *H10N 10/17* (2023.02); *H10N 10/01* (2023.02); *H01M 10/613* (2015.04)

(58) Field of Classification Search
CPC ........ H10N 10/17; H10N 10/01; H10N 10/00; H01M 10/613; H02J 1/08; H02J 7/345

USPC .......................................................... 320/135
See application file for complete search history.

(56) References Cited

U.S. PATENT DOCUMENTS

| | | | |
|---|---|---|---|
| 9,350,173 B2* | 5/2016 | Kanayama | B60L 53/14 |
| 11,258,290 B2* | 2/2022 | Monden | H02J 7/04 |
| 2003/0227278 A1 | 12/2003 | Sakuragi | |
| 2010/0174417 A1* | 7/2010 | Iida | H01M 10/425 |
| | | | 700/295 |
| 2012/0235490 A1* | 9/2012 | Lee | H02J 9/005 |
| | | | 307/66 |

(Continued)

FOREIGN PATENT DOCUMENTS

| | | |
|---|---|---|
| CN | 104081418 A | 10/2014 |
| CN | 106851025 A | 6/2017 |
| JP | 2004046088 A | 2/2004 |

(Continued)

OTHER PUBLICATIONS

Office Action in Chinese Appln. No. 202180011534.2, mailed on Apr. 9, 2025, 10 pages (with English translation).

*Primary Examiner* — M Baye Diao
(74) *Attorney, Agent, or Firm* — Fish & Richardson P.C.

(57) ABSTRACT

A residual charge removal device includes: a power storage unit; a first switching unit that is connected to a target to which electric power is supplied from a power supply device, and operates to remove a residual charge of the target by electric power supplied from the power storage unit; and a second switching unit that operates to supply electric power from the power storage unit to the first switching unit when electric power supply to the target is stopped.

6 Claims, 5 Drawing Sheets

(56) References Cited

U.S. PATENT DOCUMENTS

2014/0327450 A1\* 11/2014 Schmauss .............. G01R 31/67
  324/538
2017/0025878 A1\* 1/2017 Tsai ..................... H02J 7/0068

FOREIGN PATENT DOCUMENTS

| JP | 2006149043 | A |   | 6/2006 |              |
|----|------------|---|---|--------|--------------|
| JP | 2010148234 | A |   | 7/2010 |              |
| JP | 2014092712 | A | \* | 5/2014 | ............... H02J 7/00 |
| JP | 2016086578 | A |   | 5/2016 |              |

\* cited by examiner

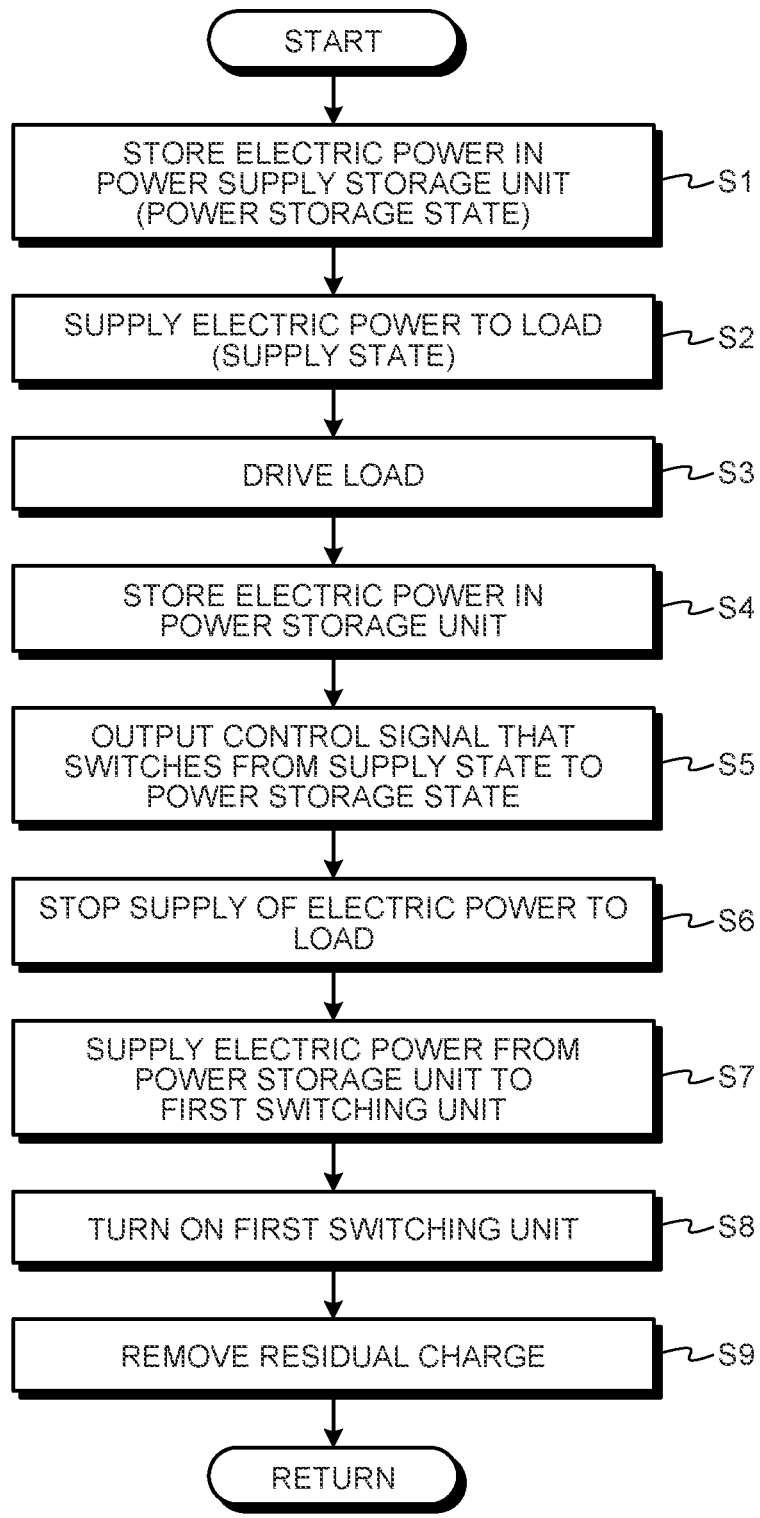

RESIDUAL CHARGE REMOVAL DEVICE

CROSS-REFERENCE TO RELATED APPLICATIONS

This application is a National Stage application of International Application No. PCT/JP2021/002610, filed on Jan. 26, 2021, which claims priority to Japanese Patent Application No. 2020-017945, filed on Feb. 5, 2020. The contents of the prior applications are incorporated herein in their entirety.

FIELD

The present disclosure relates to a residual charge removal device.

BACKGROUND

In the technical field related to electronic devices, a residual charge removal device as disclosed in Patent Literature 1 is known.

CITATION LIST

Patent Literature

Patent Literature 1: JP 2014-092712 A

SUMMARY

Technical Problem

A load such as an electronic device is driven by electric power supplied from a power supply device. In a state where electric power supply from the power supply device is stopped, if there is a residual charge, there is a possibility that the load malfunctions.

An object of the present disclosure is to smoothly remove a residual charge in a state where electric power supply from the power supply device is stopped.

Solution to Problem

According to an aspect of the present invention, a residual charge removal device comprises: a power storage unit; a first switching unit that is connected to a target to which electric power is supplied from a power supply device, and operates to remove a residual charge of the target by electric power supplied from the power storage unit; and a second switching unit that operates such that electric power is supplied from the power storage unit to the first switching unit when electric power supply to the target is stopped.

Advantageous Effects of Invention

According to the present disclosure, it is possible to smoothly remove a residual charge in a state where electric power supply from the power supply device is stopped.

BRIEF DESCRIPTION OF DRAWINGS

FIG. 6 is a flowchart illustrating an operation of the thermoelectric generator according to the embodiment.

DESCRIPTION OF EMBODIMENTS

Hereinafter, embodiments according to the present disclosure will be described with reference to the drawings, but the present disclosure is not limited thereto. The components of the embodiments described below can be appropriately combined. In addition, some components may not be used.

[Thermoelectric Generator]

Figure 1:
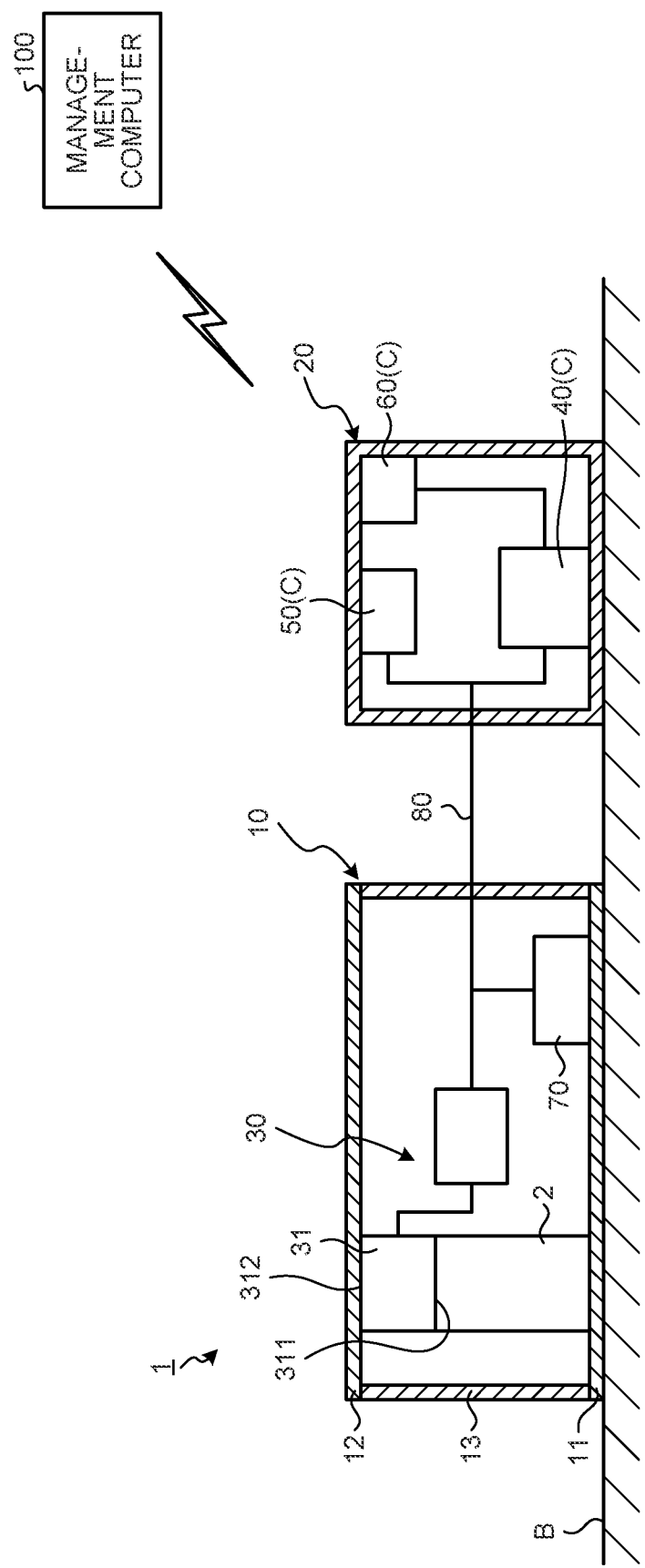
FIG. 1 is a diagram schematically illustrating a thermoelectric generator according to an embodiment.

FIG. 1 is a diagram schematically illustrating a thermoelectric generator 1 according to an embodiment. The thermoelectric generator 1 is installed in equipment B. The equipment B is provided in an industrial facility such as a factory, for example. As the equipment B, a motor that operates a pump is exemplified. The equipment B functions as a heat source of the thermoelectric generator 1.

As illustrated in FIG. 1, the thermoelectric generator 1 includes a first housing 10, a second housing 20, a power supply device 30 including a thermoelectric power generation module 31, a microcomputer 40, a sensor 50, a wireless communication device 60, and a residual charge removal device 70.

The first housing 10 accommodates the power supply device 30 and the residual charge removal device 70. The second housing 20 accommodates the microcomputer 40, the sensor 50, and the wireless communication device 60. Each of the first housing 10 and the second housing 20 is installed in the equipment B.

The first housing 10 includes a heat receiving part 11, a heat dissipating part 12, and a peripheral wall part 13. An internal space of the first housing 10 is defined by the heat receiving part 11, the heat dissipating part 12, and the peripheral wall part 13. The power supply device 30 and the residual charge removal device 70 are disposed in the internal space of the first housing 10. An external space of the first housing 10 is an atmospheric space.

The heat receiving part 11 is disposed so as to be in contact with the equipment B. The heat receiving part 11 is a plate-shaped member. The heat receiving part 11 is formed of a metal material such as aluminum or copper. The heat receiving part 11 receives heat from the equipment B. Heat of the heat receiving part 11 is transferred to the thermoelectric power generation module 31 through a heat transfer member 2.

The heat dissipating part 12 faces the heat receiving part 11 with a gap interposed therebetween. The heat dissipating part 12 is a plate-shaped member. The heat dissipating part 12 is formed of a metal material such as aluminum or copper. The heat dissipating part 12 receives heat from the thermoelectric power generation module 31. Heat of the heat dissipating part 12 is released to the atmospheric space around the thermoelectric generator 1.

The peripheral wall part 13 is disposed between a peripheral edge part of the heat receiving part 11 and a peripheral edge part of the heat dissipating part 12. The peripheral wall part 13 has an annular shape. The peripheral wall part 13 connects the heat receiving part 11 and the heat dissipating part 12. The peripheral wall part 13 is made of synthetic resin.

The power supply device 30 functions as a power supply for the microcomputer 40, the sensor 50, and the wireless communication device 60. Each of the microcomputer 40, the sensor 50, and the wireless communication device 60 is driven on the basis of electric power supplied from the power supply device 30. Each of the microcomputer 40, the sensor 50, and the wireless communication device 60 is a load C that consumes electric power supplied from the power supply device 30.

The thermoelectric generator 1 includes a power supply line 80 that transmits electric power from the power supply device 30 to the load C. In the embodiment, the power supply device 30 is connected to each of the microcomputer 40 and the sensor 50 via the power supply line 80.

The power supply device 30 includes the thermoelectric power generation module 31. The thermoelectric power generation module 31 generates electric power using the Seebeck effect. The thermoelectric power generation module 31 is disposed between the heat receiving part 11 and the heat dissipating part 12. One end face 311 of the thermoelectric power generation module 31 is heated to give a temperature difference between one end face 311 and the other end face 312 of the thermoelectric power generation module 31, whereby the thermoelectric power generation module 31 generates electric power.

The microcomputer 40 controls the thermoelectric generator 1. The microcomputer 40 is driven by electric power generated by the thermoelectric power generation module 31.

The sensor 50 detects a state of the equipment B. Examples of the sensor 50 include a vibration sensor that detects vibration of the equipment B, and a temperature sensor that detects temperature of the equipment B. The sensor 50 is driven by electric power generated by the thermoelectric power generation module 31.

The wireless communication device 60 transmits detection data of the sensor 50. The wireless communication device 60 is driven by electric power generated by the thermoelectric power generation module 31. The detection data of the sensor 50 is transmitted to a management computer 100 existing outside the thermoelectric generator 1 by the wireless communication device 60. The management computer 100 diagnoses the presence or absence of abnormality of the equipment B based on the detection data of the sensor 50.

The residual charge removal device 70 removes a residual charge of a target to which electric power is supplied from the power supply device 30. In the embodiment, the target to which electric power is supplied from the power supply device 30 includes at least one of the load C that consumes electric power supplied from the power supply device 30, and the power supply line 80 that transmits electric power from the power supply device 30 to the load C. The load C includes at least one of the microcomputer 40, the sensor 50, and the wireless communication device 60.

In a state where electric power supply from the power supply device 30 is stopped, there is a possibility that a residual charge is present in the target. The residual charge removal device 70 removes the residual charge from the target in the state where the electric power supply from the power supply device 30 is stopped.

[Thermoelectric Power Generation Module]

Figure 2:
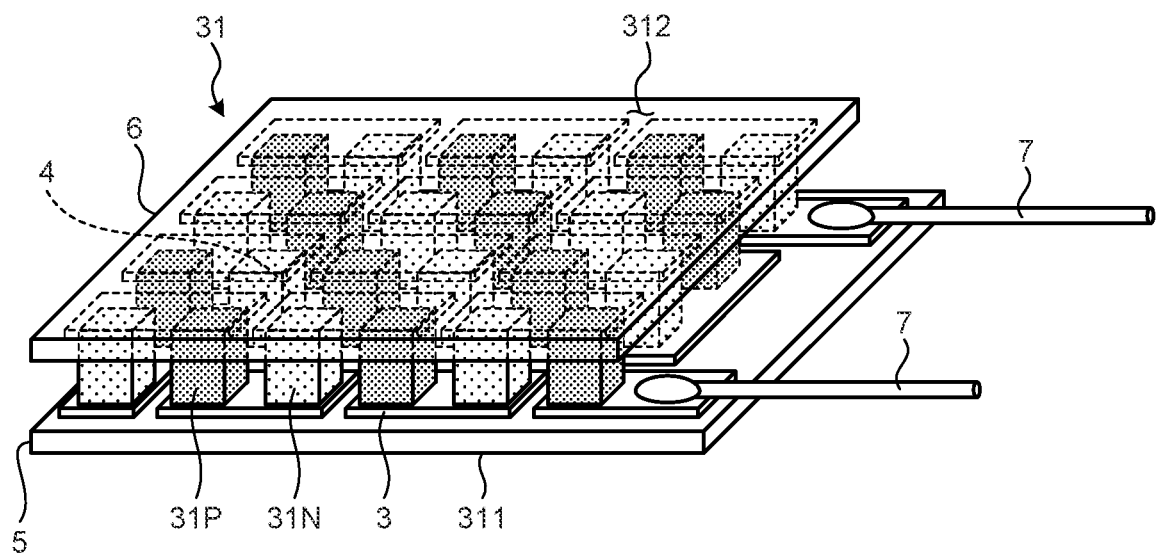
FIG. 2 is a perspective view schematically illustrating a thermoelectric power generation module according to the embodiment.

FIG. 2 is a perspective view schematically illustrating the thermoelectric power generation module 31 according to the embodiment. The thermoelectric power generation module 31 includes p-type thermoelectric semiconductor elements 31P, n-type thermoelectric semiconductor elements 31N, first electrodes 3, second electrodes 4, a first substrate 5, and a second substrate 6. The first electrodes 3 are disposed on the first substrate 5. The second electrodes 4 are disposed on the second substrate 6. On each of a surface of the first substrate 5 and a surface of the second substrate 6, the p-type thermoelectric semiconductor elements 31P and the n-type thermoelectric semiconductor elements 31N are alternately arranged. Each of the first electrodes 3 is connected to each of the p-type thermoelectric semiconductor elements 31P and the n-type thermoelectric semiconductor elements 31N. Each of the second electrodes 4 is connected to each of the p-type thermoelectric semiconductor elements 31P and the n-type thermoelectric semiconductor elements 31N. One end of each of the p-type thermoelectric semiconductor elements 31P and one end of each of the n-type thermoelectric semiconductor elements 31N are connected to each of the first electrodes 3. The other end of each of the p-type thermoelectric semiconductor elements 31P and the other end of each of the n-type thermoelectric semiconductor elements 31N are connected to each of the second electrodes 4.

Each of the p-type thermoelectric semiconductor elements 31P and the n-type thermoelectric semiconductor elements 31N includes, for example, a BiTe-based thermoelectric material. Each of the first substrate 5 and the second substrate 6 is formed of an electrically insulating material such as ceramics or polyimide.

The first substrate 5 has an end surface 311. The second substrate 6 has an end surface 312. By heating the first substrate 5, a temperature difference is provided between one end and the other end of each of the p-type thermoelectric semiconductor elements 31P and the n-type thermoelectric semiconductor elements 31N. When a temperature difference is given between one end and the other end of each of the p-type thermoelectric semiconductor elements 31P, holes move in each of the p-type thermoelectric semiconductor elements 31P. When a temperature difference is given between one end and the other end of each of the n-type thermoelectric semiconductor elements 31N, electrons move in each of the n-type thermoelectric semiconductor elements 31N. Each of the p-type thermoelectric semiconductor elements 31P and each of the n-type thermoelectric semiconductor elements 31N are connected via each of the first electrodes 3 and each of the second electrodes 4. A potential difference is generated between each of the first electrodes 3 and each of the second electrodes 4 by the holes and electrons. When the potential difference is generated between each of the first electrodes 3 and each of the second electrodes 4, the thermoelectric power generation module 31 generates electric power. Lead wires 7 are connected to the first electrodes 3. The thermoelectric power generation module 31 outputs electric power via the lead wires 7.

[Power Supply Device]

Figure 3:
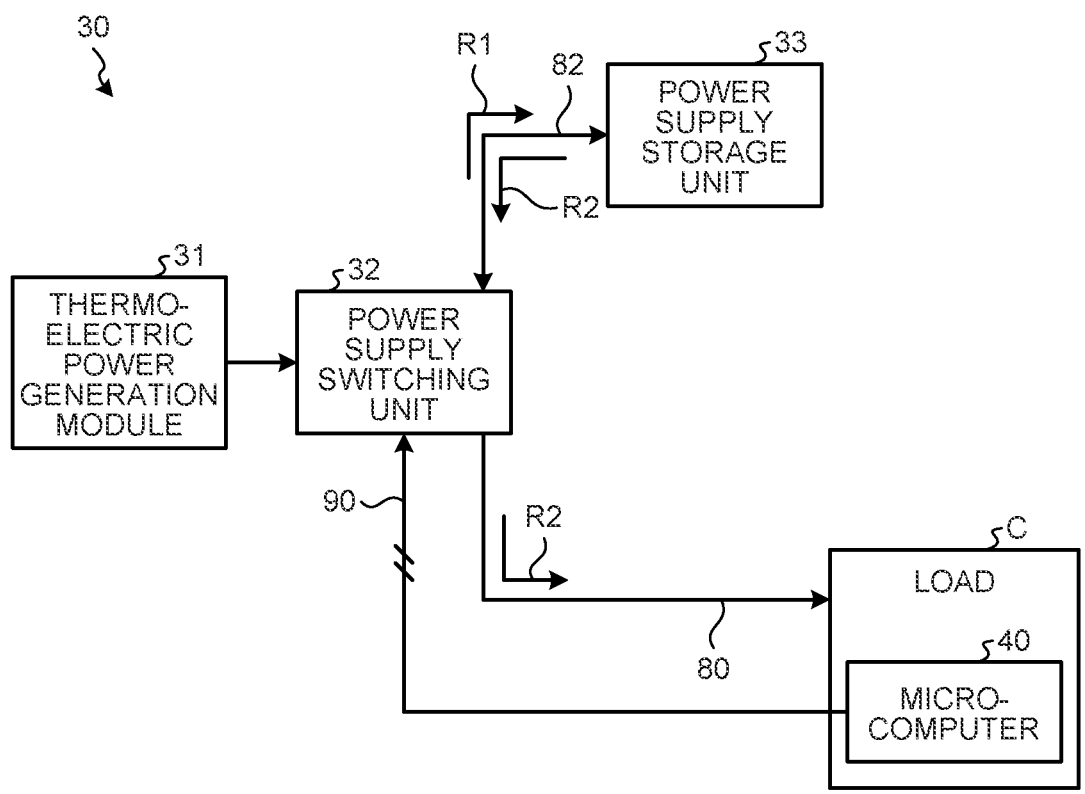
FIG. 3 is a diagram schematically illustrating a power supply device according to the embodiment.

FIG. 3 is a diagram schematically illustrating the power supply device 30 according to the embodiment. As illustrated in FIG. 3, the power supply device 30 includes the thermoelectric power generation module 31, a power supply switching unit 32, and a power supply storage unit 33.

The thermoelectric power generation module 31 generates electric power using the Seebeck effect. Electric power generated by the thermoelectric power generation module 31 is boosted by a booster (not illustrated) and then supplied to the power supply switching unit 32.

The power supply switching unit 32 operates to switch between a power storage state in which electric power generated by the thermoelectric power generation module 31 is supplied to the power supply storage unit 33 and a supply state in which electric power stored in the power supply storage unit 33 is supplied to the load C.

The power supply switching unit 32 monitors the power storage state of the power supply storage unit 33, and switches from the power storage state to the supply state when a power storage amount of the power supply storage unit 33 reaches a specified value.

The power supply switching unit 32 is connected to the power supply storage unit 33 via an electric line 82. The power supply switching unit 32 is connected to the load C via the power supply line 80. Further, the power supply switching unit 32 is connected to the microcomputer 40 via a control line 90. The control line 90 transmits a control signal from the microcomputer 40 to the power supply device 30. The control signal output from the microcomputer 40 is transmitted to the power supply switching unit 32 via the control line 90. The power supply switching unit 32 is controlled by the microcomputer 40.

When the thermoelectric power generation module 31 generates electric power, as indicated by an arrow R1, the power supply switching unit 32 operates such that the electric power generated by the thermoelectric power generation module 31 is supplied to the power supply storage unit 33 through the electric line 82. The power supply storage unit 33 stores electric power generated by the thermoelectric power generation module 31.

When the power storage amount of the power supply storage unit 33 becomes greater than or equal to the specified value, the power supply storage unit 33 releases electric power. As indicated by an arrow R2, the electric power released from the power supply storage unit 33 is supplied to the load C via the power supply line 80. The load C consumes the electric power supplied from the power supply storage unit 33.

After the power supply storage unit 33 releases the electric power, as indicated by the arrow R1, the power supply switching unit 32 operates such that the electric power generated by the thermoelectric power generation module 31 is supplied to the power supply storage unit 33 via the electric line 82. The power supply storage unit 33 stores the electric power generated by the thermoelectric power generation module 31 again.

When the power storage amount of the power supply storage unit 33 becomes greater than or equal to the specified value, the power supply storage unit 33 releases electric power. As indicated by the arrow R2, the electric power released from the power supply storage unit 33 is supplied to the load C again via the power supply line 80. The load C consumes the electric power supplied from the power supply storage unit 33.

In this way, a power storage state in which the electric power generated by the thermoelectric power generation module 31 is supplied to the power supply storage unit 33, and a supply state in which the electric power stored in the power supply storage unit 33 is supplied to the load C are repeated. The power supply storage unit 33 performs the power storage intermittently. Electric power is intermittently supplied to the load C.

In the supply state, the thermoelectric power generation module 31, the power supply storage unit 33, and the load C are connected.

In the power storage state, the supply of electric power from the power supply device 30 (power supply storage unit 33) to the load C is stopped. That is, in the power storage state, the load C is turned off.

When there is a residual charge in at least a part of the load C, the power supply line 80, and the control line 90 after the supply of electric power from the power supply device 30 to the load C is stopped and the load C is turned off, there is a possibility that the load C malfunctions.

In the embodiment, the residual charge removal device 70 operates to remove the residual charge when switched from the supply state to the power storage state.

[Residual Charge Removal Device]

Figure 4:
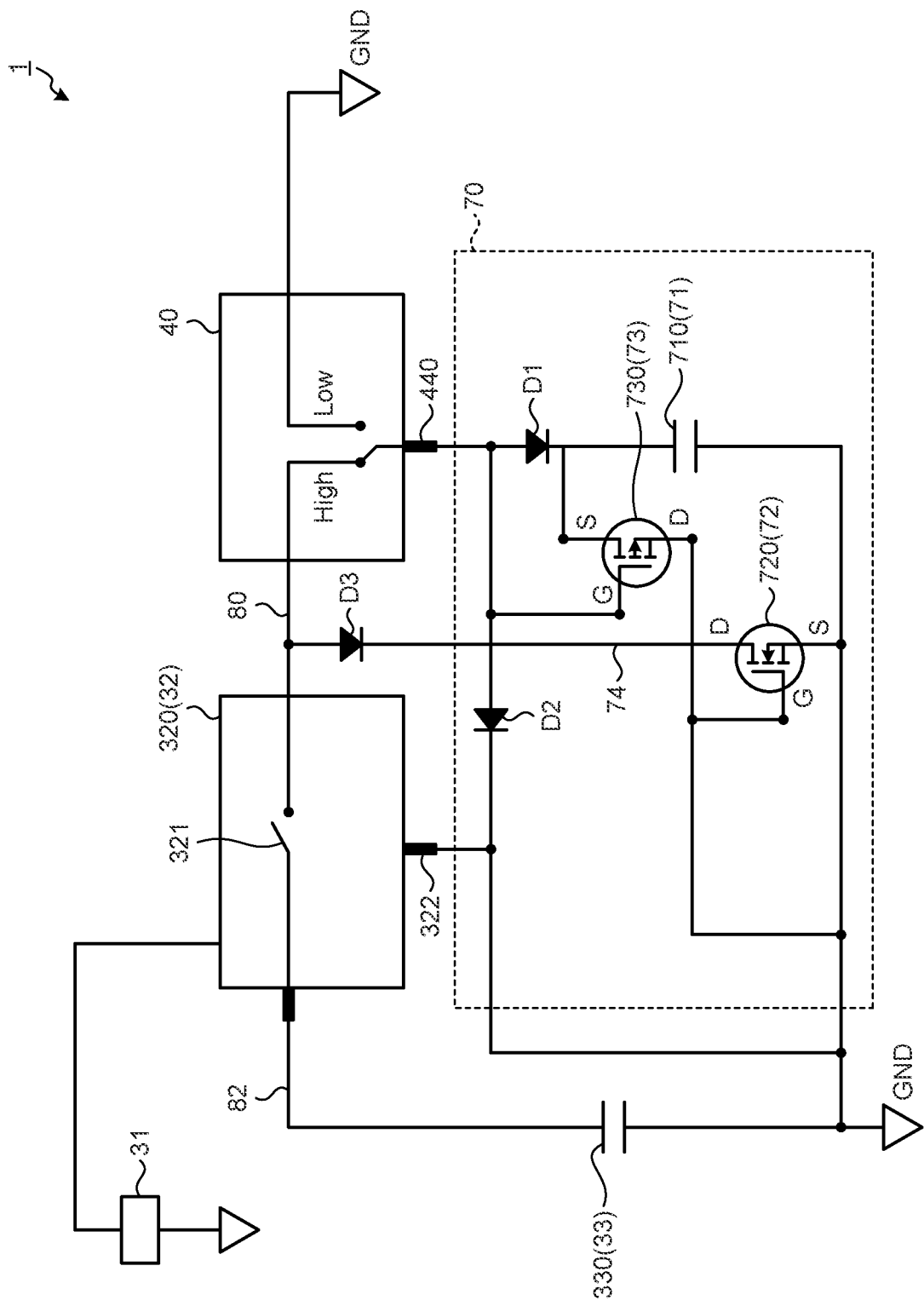
FIG. 4 is a configuration diagram illustrating a main part of hardware of the thermoelectric generator according to the embodiment.

FIG. 4 is a configuration diagram illustrating a main part of hardware of the thermoelectric generator 1 according to the embodiment. As illustrated in FIG. 4, the thermoelectric generator 1 includes the thermoelectric power generation module 31, a DC/DC converter 320, a power supply capacitor 330, the microcomputer 40, and the residual charge removal device 70.

The DC/DC converter 320 is connected to each of the thermoelectric power generation module 31, the power supply capacitor 330, and the microcomputer 40. The DC/DC converter 320 is disposed between the power supply capacitor 330 and the microcomputer 40. The DC/DC converter 320 is connected to the power supply capacitor 330 via the electric line 82. The DC/DC converter 320 is connected to the microcomputer 40 via the power supply line 80.

The DC/DC converter 320 includes a switch 321 and a switch control terminal 322.

The switch 321 switches between an energizable state in which the power supply capacitor 330 and the microcomputer 40 can be energized and a non-energizable state in which the power supply capacitor 330 and the microcomputer 40 cannot be energized. When the switch 321 is turned on, the power supply capacitor 330 and the microcomputer 40 are energizable. When the switch 321 is turned off, the power supply capacitor 330 and the microcomputer 40 are not energized.

The switch control terminal 322 controls the switch 321. The switch control terminal 322 is controlled by the microcomputer 40. The switch control terminal 322 is set to either a High level or a Low level. When the switch control terminal 322 is at the High level, an on state of the switch 321 is maintained.

The power supply capacitor 330 stores electric power generated by the thermoelectric power generation module 31. When a power storage amount of the power supply capacitor 330 is less than a specified value, the switch 321 is turned off. When the power storage amount of the power supply capacitor 330 is greater than or equal to the specified value, the switch 321 is turned on.

When the switch 321 is turned on, the power supply capacitor 330 and the microcomputer 40 are energizable. When the power supply capacitor 330 and the microcomputer 40 are in the energizable state, electric power stored in the power supply capacitor 330 is supplied to the microcomputer 40 via the DC/DC converter 320 and the power supply line 80.

The microcomputer 40 includes a micro processing unit (MPU). The microcomputer 40 is driven on the basis of the electric power supplied from the power supply capacitor 330. The microcomputer 40 being in a driving state means that the electric power is being supplied to the microcomputer 40. The microcomputer 40 being in a stopped state means that no electric power is supplied to the microcomputer 40.

The microcomputer 40 includes a busy terminal 440. When the microcomputer 40 is in the driving state, the busy terminal 440 is set to a High level. When the microcomputer 40 is in the stopped state, the busy terminal 440 is set to a Low level.

By setting the busy terminal 440 to the High level, the switch control terminal 322 is set to the High level, and the on state of the switch 321 is maintained.

The residual charge removal device 70 includes a capacitor 710, a first transistor 720, and a second transistor 730.

A diode D1 is disposed between the busy terminal 440 and the capacitor 710. By setting the busy terminal 440 to the High level, electric power is supplied from the power supply capacitor 330 to the capacitor 710 via the microcomputer 40. That is, when the busy terminal 440 is set to the High level, the capacitor 710 is stored. By setting the busy terminal 440 to the Low level, the busy terminal 440 is connected to a ground GND.

The first transistor 720 is connected to the power supply line 80. A diode D3 is disposed on the power supply line 80. The first transistor 720 is a field effect transistor (FET). In the embodiment, the first transistor 720 is an N-channel metal oxide semiconductor field effect transistor (N-channel MOSFET).

When electric power is supplied from the capacitor 710 to the first transistor 720, the first transistor 720 is turned on. When the first transistor 720 is turned on, the power supply line 80 and the ground GND are energizable via the first transistor 720. When the power supply line 80 and the ground GND are in the energizable state, the residual charge of the power supply line 80 is released to the ground GND. That is, the residual charge of the power supply line 80 is removed.

The second transistor 730 is connected to the microcomputer 40. A diode D2 is disposed between the second transistor 730 and the ground GND. The second transistor 730 is a field effect transistor (FET). In the embodiment, the second transistor 730 is a P-channel metal oxide semiconductor field effect transistor (P-channel MOSFET). When the busy terminal 440 is set to the High level, the second transistor 730 is turned off. By setting the busy terminal 440 to the Low level, the second transistor 730 is turned on. That is, the second transistor 730 is turned off when the microcomputer 40 is in the driving state, and is turned on when the microcomputer 40 is in the stopped state.

When the second transistor 730 is turned on, the capacitor 710 and the first transistor 720 can be energized via the second transistor 730. When the capacitor 710 and the first transistor 720 are in the energizable state, the electric power (charge) stored in the capacitor 710 is supplied to the first transistor 720. When electric power is supplied from the capacitor 710 to the first transistor 720, the first transistor 720 is turned on.

Figure 5:
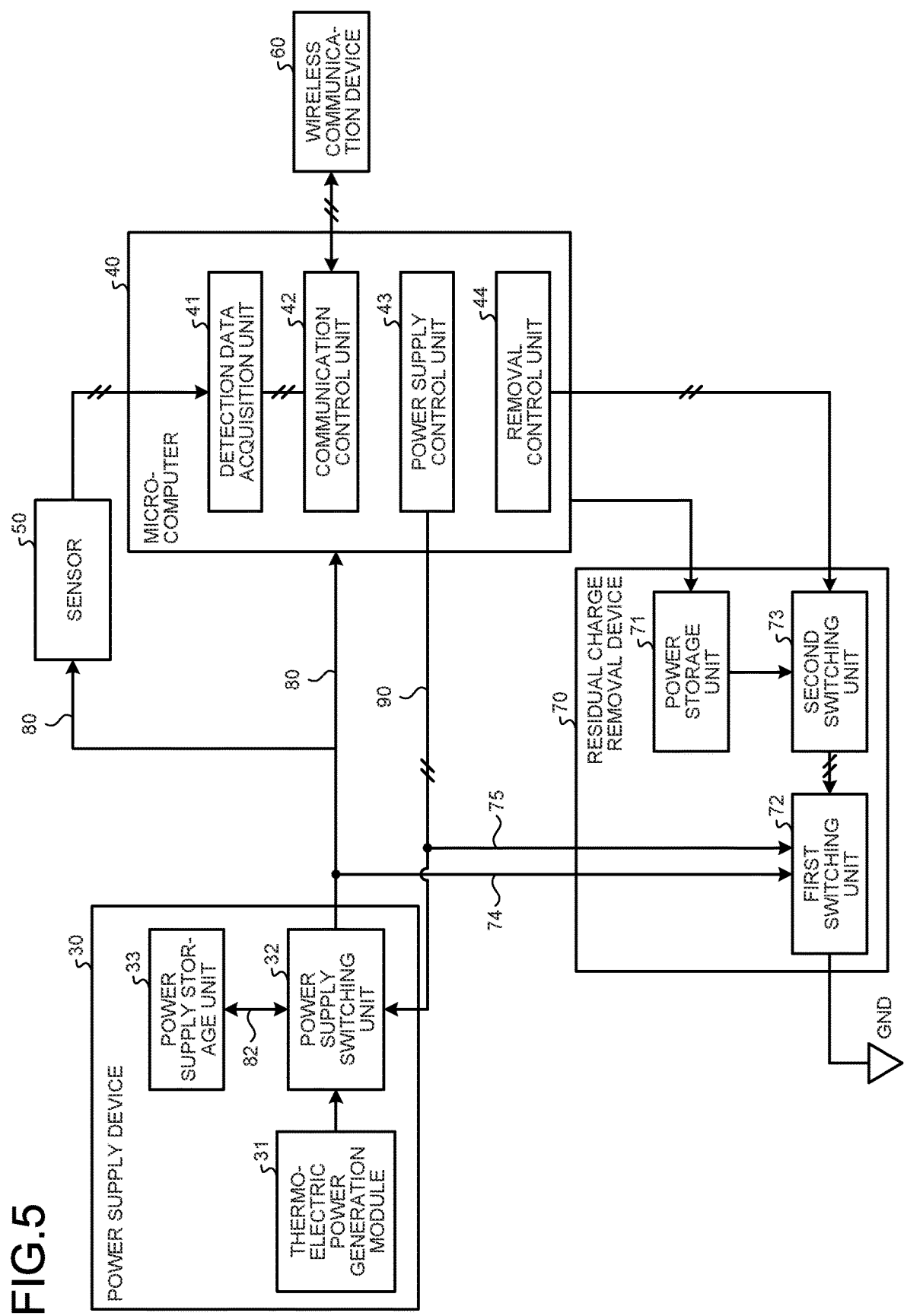
FIG. 5 is a block diagram illustrating the thermoelectric generator according to the embodiment.

FIG. 5 is a block diagram illustrating the thermoelectric generator 1 according to the embodiment. As illustrated in FIG. 5, the thermoelectric generator 1 includes the power supply device 30, the microcomputer 40, the sensor 50, the wireless communication device 60, and the residual charge removal device 70.

The power supply device 30 includes the thermoelectric power generation module 31, the power supply switching unit 32, and the power supply storage unit 33.

The power supply switching unit 32 includes the DC/DC converter 320 described with reference to FIG. 4. The power supply switching unit 32 operates to switch between the power storage state in which electric power generated by the thermoelectric power generation module 31 is supplied to the power supply storage unit 33 and the supply state in which electric power stored in the power supply storage unit 33 is supplied to the target.

The power supply switching unit 32 operates so as to be in the power storage state when the power storage amount of the power supply storage unit 33 is less than the specified value, and to be in the supply state when the power storage amount of the power supply storage unit 33 is greater than or equal to the specified value. When the power storage amount of the power supply storage unit 33 changes from a value less than the specified value to a value greater than or equal to the specified value, the switch 321 of the power supply switching unit 32 is turned on. When the switch 321 is turned on, the power supply storage unit 33 and the microcomputer 40 can be energized.

The microcomputer 40 includes a micro processing unit (MPU). The microcomputer 40 includes a detection data acquisition unit 41, a communication control unit 42, a power supply control unit 43, and a removal control unit 44.

The detection data acquisition unit 41 acquires detection data of the sensor 50. The communication control unit 42 controls the wireless communication device 60. The communication control unit 42 controls the wireless communication device 60 so that the detection data of the sensor 50 is transmitted to the management computer 100.

The power supply control unit 43 outputs a control signal for controlling the power supply switching unit 32. The control line 90 that transmits the control signal from the microcomputer 40 to the power supply device 30 is provided. The control signal output from the power supply control unit 43 is transmitted to the power supply switching unit 32 via the control line 90.

The removal control unit 44 outputs a control signal for controlling the residual charge removal device 70.

The residual charge removal device 70 includes a power storage unit 71, a first switching unit 72, and a second switching unit 73.

The power storage unit 71 stores electric power (charge). The power storage unit 71 includes the capacitor 710 described with reference to FIG. 4. The power storage unit 71 stores electric power supplied from the power supply device 30 (power supply storage unit 33) via the power supply line 80 and the microcomputer 40.

The first switching unit 72 is connected to the target to which electric power is supplied from the power supply device 30. In the embodiment, the first switching unit 72 is connected to each of the power supply line 80 and the control line 90. The first switching unit 72 is connected to the power supply line 80 via a connection line 74. The first switching unit 72 is connected to the control line 90 via a connection line 75.

The first switching unit 72 operates such that a residual charge of the power supply line 80 and a residual charge of the control line 90 are removed by the supply of electric power from the power storage unit 71. The first switching unit 72 is connected to the ground GND. When electric power is supplied from the power storage unit 71, the first switching unit 72 operates so that the residual charge of the power supply line 80 and the residual charge of the control line 90 are released to the ground GND.

The first switching unit 72 includes the first transistor 720 described with reference to FIG. 4. When electric power is supplied from the power storage unit 71, the first switching unit 72 is turned on to connect each of the power supply line 80 and the control line 90 to the ground GND. When the first switching unit 72 is turned on, the residual charge of the power supply line 80 and the residual charge of the control line 90 are released to the ground GND via the first switching unit 72.

The second switching unit 73 operates such that electric power is supplied from the power storage unit 71 to the first switching unit 72 when electric power supply from the power supply device 30 to the target is stopped. In the embodiment, the second switching unit 73 operates such that electric power is supplied from the power storage unit 71 to the first switching unit 72 when electric power supply from the power supply device 30 to the microcomputer 40 and the sensor 50 is stopped.

As described above, the power supply switching unit 32 switches between the power storage state in which electric power generated by the thermoelectric power generation module 31 is supplied to the power supply storage unit 33, and the supply state in which electric power stored in the power supply storage unit 33 is supplied to the microcomputer 40 and the sensor 50. The second switching unit 73 operates such that electric power is supplied from the power storage unit 71 to the first switching unit 72 when the supply state is switched to the power storage state.

The second switching unit 73 includes the second transistor 730 described with reference to FIG. 4. When electric power supply from the power supply storage unit 33 to the microcomputer 40 is stopped, the second switching unit 73 is turned on to connect the power storage unit 71 and the first switching unit 72. When the second switching unit 73 is turned on, electric power of the power storage unit 71 is supplied to the first switching unit 72 via the second switching unit 73. The first switching unit 72 is turned on by electric power supplied from the power storage unit 71. When the first switching unit 72 is turned on, the residual charge of the power supply line 80 and the residual charge of the control line 90 are released to the ground GND via the first switching unit 72.

[Operation]

FIG. 6 is a flowchart illustrating an operation of the thermoelectric generator 1 according to the embodiment. Electric power generated by the thermoelectric power generation module 31 is supplied to the power supply storage unit 33. The power supply storage unit 33 stores the electric power generated by the thermoelectric power generation module 31 (Step S1).

When the power storage amount of the power supply storage unit 33 is less than the specified value, the switch control terminal 322 of the power supply switching unit 32 is at the Low level, and the switch 321 of the power supply switching unit 32 is in an off state. When the power storage amount of the power supply storage unit 33 is less than the specified value, the power storage state in which the electric power generated by the thermoelectric power generation module is supplied to the power supply storage unit 33 is maintained.

When the power storage amount of the power supply storage unit 33 changes from a value less than the specified value to a value greater than or equal to the specified value, the power storage state is switched to the supply state. That is, when the power storage amount of the power supply storage unit 33 is greater than or equal to the specified value, the switch 321 of the power supply switching unit 32 is turned on, and the electric power stored in the power supply storage unit 33 is supplied to the load C including the microcomputer 40 and the sensor 50 (Step S2).

When electric power is supplied to the microcomputer 40, the busy terminal 440 of the microcomputer 40 is set to the High level. By setting the busy terminal 440 to the High level, the switch control terminal 322 of the power supply switching unit 32 is set to the High level, and the on state of the switch 321 of the power supply switching unit 32 is maintained.

When electric power is supplied to the microcomputer 40 and the sensor 50, each of the microcomputer 40 and the sensor 50 is driven (Step S3).

Each of the microcomputer 40 and the sensor 50 performs specified processing. The sensor 50 detects a state of the equipment B. The detection data acquisition unit 41 acquires detection data of the sensor 50. The communication control unit 42 controls the wireless communication device 60 to transmit the detection data of the sensor 50 to the management computer 100.

Further, when the microcomputer 40 is driven, electric power from the power supply device 30 is supplied to the power storage unit 71 via the microcomputer 40. The power storage unit 71 stores the electric power supplied from the power supply device 30 via the microcomputer 40 (Step S4).

When the processing of each of the microcomputer 40 and the sensor 50 ends, the power supply control unit 43 outputs a control signal to the power supply switching unit 32 so as to switch from the supply state to the power storage state. The control signal output from the power supply control unit 43 is transmitted to the power supply switching unit 32 via the control line 90 (Step S5).

In the embodiment, when the processing of each of the microcomputer 40 and the sensor 50 ends, the busy terminal 440 is set to the Low level. When the busy terminal 440 is set to the Low level, a control signal for setting the switch control terminal 322 to the Low level is output from the power supply control unit 43 to the power supply switching unit 32. The control signal for setting the switch control terminal 322 to the Low level corresponds to a control signal for switching from the supply state to the power storage state. When the switch control terminal 322 is set to the Low level, the switch 321 of the power supply switching unit 32 is turned off to switch from the supply state to the power storage state.

In the power storage state, the supply of electric power to the microcomputer 40 and the sensor 50 is stopped. The microcomputer 40 and the sensor 50 are turned off (Step S6).

When the supply of electric power to the microcomputer 40 and the sensor 50 is stopped, the second switching unit 73 operates so that electric power is supplied from the power storage unit 71 to the first switching unit 72 (Step S7).

In the embodiment, when the busy terminal 440 is set to the Low level, the second switching unit 73 is turned on. When the second switching unit 73 is turned on, electric power of the power storage unit 71 is supplied to the first switching unit 72 via the second switching unit 73. When the electric power of the power storage unit 71 is supplied to the first switching unit 72, the first switching unit 72 is turned on (Step S8).

When the first switching unit 72 is turned on, the power supply line 80 and the ground GND are energizable via the first switching unit 72. As a result, a residual charge existing in the power supply line 80 is released to the ground GND via the first switching unit 72. That is, the residual charge of the power supply line 80 is removed (Step S9).

The processing from Step S1 to Step S9 is repeated. That is, the operation of storing power in the power supply storage unit 33 with the electric power generated by the thermoelectric power generation module 31, the operation of supplying the electric power stored in the power supply storage unit 33 to the load C, and the operation of removing the residual charge are repeated.

Advantageous Effects

As described above, according to the embodiment, the residual charge removal device 70 smoothly removes the residual charge existing in the target in a state where the supply of electric power from the power supply device 30 to the target is stopped. When the supply of electric power from the power supply device 30 to the target is stopped, the second switching unit 73 is operated such that electric power stored in the power storage unit 71 is supplied to the first switching unit 72. As a result, even if the supply of electric power from the power supply device 30 is stopped, the first switching unit 72 can be turned on based on the electric power supplied from the power storage unit 71. When the first switching unit 72 is turned on, the residual charge of the target is released to the ground GND via the first switching unit 72. Therefore, the residual charge present in the target is smoothly removed.

The power storage unit 71 stores electric power supplied from the power supply device 30 via the microcomputer 40. As a result, the electric power from the power supply device 30 is efficiently stored in the power storage unit 71.

The power storage state in which the electric power generated by the thermoelectric power generation module 31 is supplied to the power supply storage unit 33, and the supply state in which the electric power stored in the power supply storage unit 33 is supplied to the load C are repeated. In the embodiment, the power supply storage unit 33 intermittently performs power storage, and the detection data of the sensor 50 is intermittently transmitted. When the supply state is switched to the power storage state, the residual charge is removed by the residual charge removal device 70. Accordingly, malfunction of the sensor 50 and malfunction of the wireless communication device 60 are suppressed. Therefore, the detection data of the state of the equipment B is appropriately transmitted to the management computer 100.

Other Embodiments

In the above-described embodiment, the first switching unit 72 is connected to each of the power supply line 80 and the control line 90. As a result, the residual charge of the power supply line 80 and the residual charge of the control line 90 are smoothly removed. Note that the first switching unit 72 may be connected to the power supply line 80 but not to the control line 90. Further, the first switching unit 72 may be connected to the load C. That is, the first switching unit 72 may be connected to at least one of the microcomputer 40, the sensor 50, and the wireless communication device 60.

In the above-described embodiment, the power storage unit 71 stores the electric power supplied from the power supply device 30 via the microcomputer 40. The electric power output from the power supply device 30 may be supplied to the power storage unit 71 without passing through the microcomputer 40.

The invention claimed is:

1. A residual charge removal device comprising:
    a power storage unit;
    a first switching unit that is connected to a target to which electric power is supplied from a power supply device, and operates to remove a residual charge of the target by electric power supplied from the power storage unit; and
    a second switching unit that operates such that electric power is supplied from the power storage unit to the first switching unit when electric power supply to the target is stopped.

2. The residual charge removal device according to claim 1, wherein the power storage unit stores electric power supplied from the power supply device via the target.

3. The residual charge removal device according to claim 1, wherein the target includes at least one of a load that consumes electric power supplied from the power supply device, and a power supply line that transmits electric power from the power supply device to the load.

4. The residual charge removal device according to claim 1, wherein the target includes a computer that consumes electric power supplied from the power supply device.

5. The residual charge removal device according to claim 4, wherein a control line that transmits a control signal from the computer to the power supply device is provided, and the first switching unit operates to remove a residual charge in the control line.

6. The residual charge removal device according to claim 1, wherein;
    the power supply device includes a thermoelectric power generation module, a power supply switching unit, and a power supply storage unit,
    the power supply switching unit operates to switch between a power storage state in which electric power generated by the thermoelectric power generation module is supplied to the power supply storage unit and a supply state in which electric power stored in the power supply storage unit is supplied to the target, and
    the second switching unit operates such that electric power is supplied from the power storage unit to the first switching unit when the supply state is switched to the power storage state.

* * * * *